United States Patent
Tanaka

(10) Patent No.: US 10,424,512 B2
(45) Date of Patent: Sep. 24, 2019

(54) PROCESSING METHOD FOR SECTOR-SHAPED WAFER PIECE

(71) Applicant: DISCO CORPORATION, Tokyo (JP)

(72) Inventor: Makoto Tanaka, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/994,661

(22) Filed: May 31, 2018

(65) Prior Publication Data

US 2018/0350681 A1 Dec. 6, 2018

(30) Foreign Application Priority Data

Jun. 1, 2017 (JP) .................................. 2017-108969

(51) Int. Cl.
| | | |
|---|---|---|
| *H01L 21/78* | (2006.01) | |
| *H01L 21/683* | (2006.01) | |
| *H01L 23/544* | (2006.01) | |
| *H01L 21/67* | (2006.01) | |
| *H01L 21/68* | (2006.01) | |
| *H01L 21/66* | (2006.01) | |

(52) U.S. Cl.
CPC ........ *H01L 21/78* (2013.01); *H01L 21/67259* (2013.01); *H01L 21/681* (2013.01); *H01L 21/6836* (2013.01); *H01L 21/6838* (2013.01); *H01L 22/20* (2013.01); *H01L 23/544* (2013.01); *H01L 21/67092* (2013.01); *H01L 2221/68327* (2013.01); *H01L 2223/5446* (2013.01); *H01L 2223/54426* (2013.01)

(58) Field of Classification Search
CPC ....... H01L 21/3065–30655; H01L 21/78–786; H01L 21/67259; H01L 21/6838
See application file for complete search history.

(56) References Cited

U.S. PATENT DOCUMENTS

2014/0127882 A1* 5/2014 Sekiya .................... H01L 21/78
438/462
2017/0213756 A1* 7/2017 Yoshida .................. H01L 22/12

FOREIGN PATENT DOCUMENTS

JP  2002039725 A  2/2002

* cited by examiner

*Primary Examiner* — Tucker J Wright
*Assistant Examiner* — Wilner Jean Baptiste
(74) *Attorney, Agent, or Firm* — Greer Burns & Crain, Ltd.

(57) ABSTRACT

A sector-shaped wafer piece is processed according to the shape of the piece obtained by dividing a wafer into quarters. Information is collected on the shapes of four patterns of the quarter wafer pieces different in the position of a circular arc of an outer periphery and on processing feed quantities corresponding to the shapes of the four patterns. A pattern is selected by calculating a region of a square having vertical and horizontal sides equal to the two sides of the quarter wafer piece, imaging each of the sides to search for the presence/absence of a target pattern, and selecting that one of the four patterns to which the held quarter wafer piece corresponds. The held quarter wafer piece is processed along division lines with a processing feed quantity corresponding to the selected pattern.

6 Claims, 4 Drawing Sheets

PROCESSING METHOD FOR SECTOR-SHAPED WAFER PIECE

BACKGROUND OF THE INVENTION

Field of the Invention

The present invention relates to a processing method for a sector-shaped wafer piece obtained by dividing a wafer, such as a semiconductor wafer or an optical device wafer, into quarters.

Description of the Related Art

Wafers such as a silicon wafer formed on its front surface with a plurality of semiconductor devices and a sapphire wafer, SiC wafer or the like formed with a plurality of optical devices such as light-emitting diodes (LEDs), are formed in a disk-like shape.

The devices are partitioned by a plurality of crossing division lines (streets), and cutting by a cutting blade (cutting apparatus) is performed or ablation processing or formation of modified layers by inside processing using a laser beam (laser processing apparatus) is performed, along the division lines, whereby the wafer is divided into individual device chips.

In recent years, attendant on the trend toward smaller device chips or toward larger wafer diameter, the processing time per wafer has tended to be longer. In view of this, a process may sometimes be selected in which, for example, one sheet of wafer is divided into quarters, and the quarters are processed by a separate processing apparatus. In this case, since the chips can be continuously fed to the subsequent step, there is an effect that the process as a whole proceeds efficiently.

SUMMARY OF THE INVENTION

However, in the case of dicing the quarter wafer pieces (sector-shaped wafer pieces) obtained by dividing one sheet of wafer into quarters, there is a problem that the processing time cannot be shortened unless a processing feed quantity according to the shape of the quarter wafer piece is set.

Accordingly, it is an object of the present invention to provide a processing method for a wafer by which a large-diameter wafer can be efficiently processed.

In accordance with an aspect of the present invention, there is provided a processing method for a sector-shaped wafer piece, for processing a sector-shaped quarter wafer piece obtained by dividing into quarters a disk-shaped wafer which has a device formed in each of regions on its front surface partitioned by a plurality of crossing division lines and which has at its outer periphery a notch indicative of its crystal orientation, the processing being performed along the division lines, and the processing being performed with a processing feed quantity according to a shape of the quarter wafer piece. The processing method includes an information collecting step of collecting information on shapes of four patterns of the quarter wafer pieces which are different in position of a circular arch of an outer periphery in the case where the quarter wafer pieces with the crystal orientation positioned in a predetermined direction are each held by a holding surface of a chuck table, and on processing feed quantities corresponding to the shapes of the four patterns, a wafer unit forming step of adhering a back surface of the quarter wafer piece to a dicing tape having an outer peripheral portion attached to an annular frame, to form a wafer unit, a holding step of suction holding the quarter wafer piece of the wafer unit by a chuck table of a processing apparatus through the dicing tape after the wafer unit forming step is conducted, an alignment step of imaging the quarter wafer piece by an imaging unit of the processing apparatus, and aligning the division line extending in a first direction to a processing feed direction, based on target patterns formed in the devices after the holding step is conducted, a pattern selection step of selecting that one of the four patterns to which the quarter wafer piece held by the chuck table corresponds after the alignment step is conducted, and a processing step of processing the quarter wafer piece held by the chuck table along the division line with the processing feed quantity corresponding to the selected pattern after the pattern selection step is conducted.

Preferably, the pattern selection step includes a target pattern detection step of calculating a region of a square having vertical and horizontal sides equal to two sides of the quarter wafer piece, searching for the target pattern in the device at a center of each of the four sides of the square by the imaging unit, and detecting the target patterns from the two sides of the quarter wafer piece, and a selection step of selecting, based on the positions of the sides where the target pattern has been detected, that one of first quadrant, second quadrant, third quadrant, and fourth quadrant of the wafer in an XY rectangular coordinate system before quadrisection to which the quarter wafer piece corresponds.

According to the processing method of the present invention, there is obtained an effect such that it is possible to detect the orientation of the quarter wafer piece by detecting the target patterns, without need for an exclusive-use apparatus for recognizing a large region for shape recognition, and to automatically optimize the processing feed quantity.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
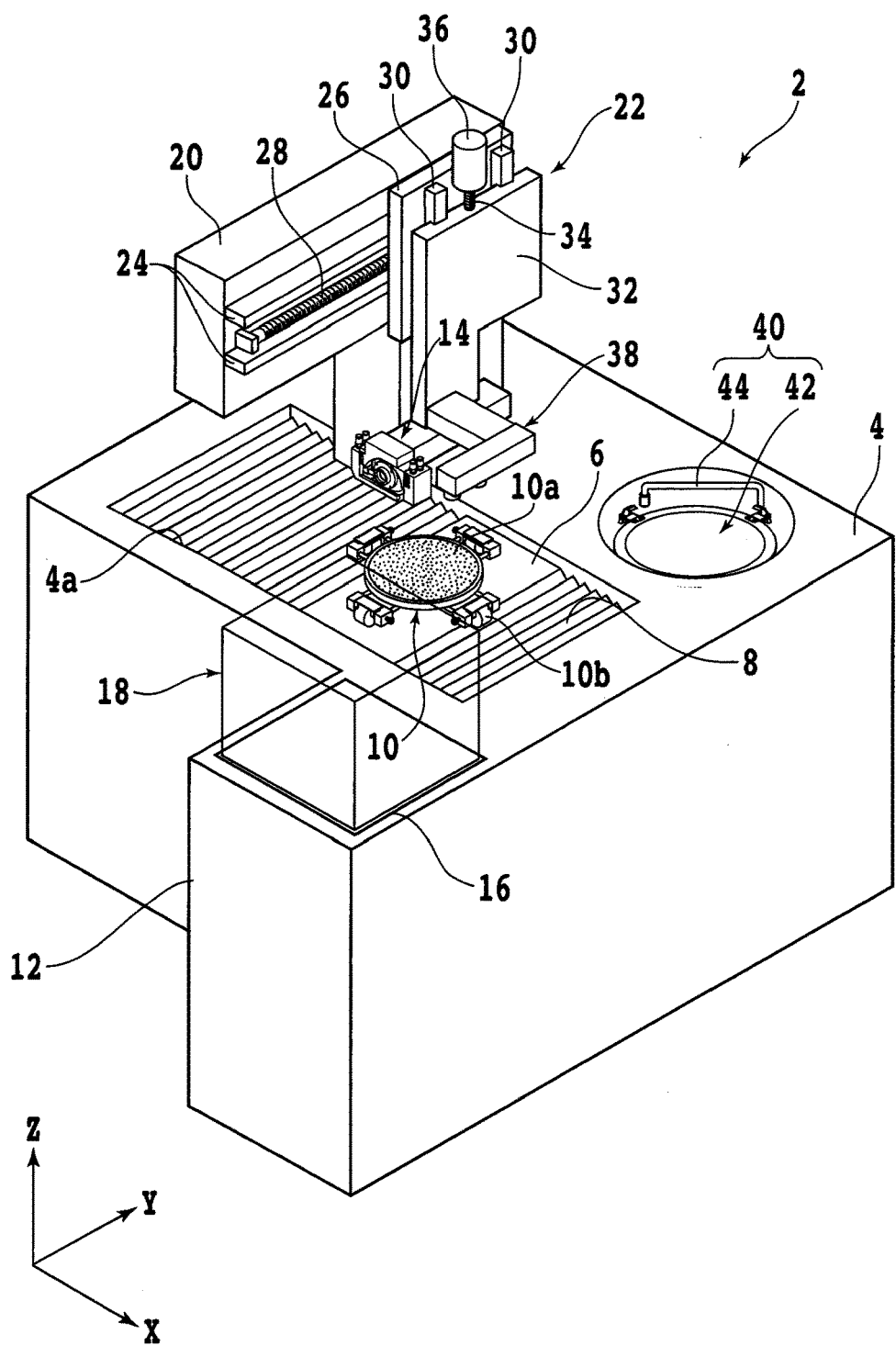
FIG. 1 is a perspective view of a cutting apparatus.

An embodiment of the present invention will be described in detail below, referring to the drawings. Referring to FIG. 1, there is depicted a perspective view of a cutting apparatus according to the present embodiment. A cutting apparatus 2 has a support base 4, an upper surface of which is formed with an opening 4a in the shape of a rectangle elongated in an X-axis direction (processing feed direction). In the opening 4a, there are provided an X-axis moving table 6, an X-axis moving mechanism (not depicted) that moves the X-axis moving table 6 in the X-axis direction, and a dust-proof and droplet-proof cover 8 that covers the X-axis moving mechanism. The X-axis moving mechanism has a pair of X-axis guide rails (not depicted) parallel to the X-axis direction, and the X-axis moving table 6 is slidably mounted to the X-axis guide rails.

A nut section (not depicted) is provided on a lower surface side of the X-axis moving table 6, and an X-axis ball screw (not depicted) parallel to the X-axis guide rails is in screw engagement with the nut section. An X-axis pulse motor (not depicted) is connected to one end portion of the X-axis ball screw. When the X-axis ball screw is rotated by the X-axis pulse motor, the X-axis moving table 6 is moved in the X-axis direction along the X-axis guide rails.

A chuck table 10 for holding a workpiece by suction is provided on the X-axis moving table 6. The chuck table 10 is connected to a rotational drive source (not depicted) such as a motor, and is rotated about a rotational axis which is substantially parallel to a Z-axis direction (vertical direction). In addition, the chuck table 10 is put to processing feed in the X-axis direction by the aforementioned X-axis moving mechanism.

A front surface (upper surface) of the chuck table 10 is a holding surface 10*a* for holding the workpiece thereon by suction. The holding surface 10*a* is connected to a suction source (not depicted) through a passage (not depicted) formed in the inside of the chuck table 10. In the periphery of the chuck table 10, there are provided clamps 10*b* for fixing the workpiece.

The workpiece is, for example, a semiconductor wafer, is adhered onto a tape held by an annular frame, and is handled together with the annular frame. Where the workpiece is handled by use of the annular frame and the tape, the workpiece can be protected from shock or the like generated during carrying thereof. Further, when the tape is expanded, it is thereby possible to divide the workpiece having undergone cutting, or to widen the interval of chips after the division. Note that the workpiece may be cut alone, without using the annular frame or the tape.

At a corner section on the front side of an apparatus base 4 remote from the opening 4*a*, there is provided a projecting section 12 which projects sideways from the apparatus base 4. The projecting section 12 is formed therein with a space, and a cassette elevator 16 capable of moving upward and downward is disposed in the space. A cassette 18 capable of accommodating a plurality of workpieces is mounted on an upper surface of the cassette elevator 16.

At a position proximate to the opening 4*a*, there is provided a carrying unit (not depicted) that carries the aforementioned workpiece to the chuck table 10. The workpiece drawn out of the cassette 18 by the carrying unit is mounted on the holding surface 10*a* of the chuck table 10.

A support structure 20 that supports a cutting unit 14 for cutting the workpiece is disposed on an upper surface of the apparatus base 4 in such a manner as to project to the upper side of the opening 4*a*. A cutting unit moving mechanism 22 that moves the cutting unit 14 in a Y-axis direction (indexing feed direction) and the Z-axis direction is provided at an upper portion of a front surface of the support structure 20.

The cutting unit moving mechanism 22 has a pair of Y-axis guide rails 24 which are disposed on a front surface of the support structure 20 and are parallel to the Y-axis direction. A Y-axis moving plate 26 constituting the cutting unit moving mechanism 22 is slidably mounted to the Y-axis guide rails 24. A nut section (not depicted) is provided on a back surface side (rear surface side) of the Y-axis moving plate 26, and a Y-axis ball screw 28 parallel to the Y-axis guide rails 24 is in screw engagement with the nut section.

A Y-axis pulse motor (not depicted) is connected to one end portion of the Y-axis ball screw 28. When the Y-axis ball screw 28 is rotated by the Y-axis pulse motor, the Y-axis moving plate 26 is moved in the Y-axis direction along the Y-axis guide rails 24. On a front surface of the Y-axis moving plate 26, there are provided a pair of Z-axis guide rails 30 which are parallel to the Z-axis direction. A Z-axis moving plate 32 is slidably mounted to the Z-axis guide plate 30.

A nut section (not depicted) is provided on a back surface side (rear surface side) of the Z-axis moving plate 32, and a Z-axis ball screw 34 parallel to the Z-axis guide rails 30 is in screw engagement with the nut section. A Z-axis pulse motor 36 is connected to one end portion of the Z-axis ball screw 34. When the Z-axis ball screw 34 is rotated by the Z-axis pulse motor 36, the Z-axis moving plate 32 is moved in the Z-axis direction along the Z-axis guide rails 30.

The cutting unit 14 that processes the workpiece and an imaging unit 38 are fixed to a lower portion of the Z-axis moving plate 32. When the Y-axis moving plate 26 is moved in the Y-axis direction by the cutting unit moving mechanism 22, the cutting unit 14 and the imaging unit 38 are put to indexing feeding, and when the Z-axis moving plate 32 is moved in the Z-axis direction, the cutting unit 14 and the imaging unit 38 are moved upward or downward.

Numeral 40 denotes a cleaning unit, and the workpiece having undergone cutting by the cutting unit 14 is carried from the chuck table 10 to the cleaning unit 40 by a carrying mechanism (not depicted). The cleaning unit 40 has a spinner table 42 that holds the workpiece by suction in a tubular cleaning space. A rotational drive source such as a motor for rotating the spinner table 42 at a predetermined speed is connected to a lower portion of the spinner table 42.

On the upper side of the spinner table 42, there is disposed a jet nozzle 44 that jets a cleaning fluid (typically, a binary fluid obtained by mixing water and air) toward the workpiece. When the cleaning fluid is jetted from the jet nozzle 44 while rotating the spinner table 42 that holds the workpiece, the workpiece having been cut can be cleaned. The workpiece cleaned by the cleaning unit 40 is accommodated into the cassette 18 by a carrying mechanism (not depicted).

In a processing method for a sector-shaped wafer piece according to the present embodiment, first, a disk-shaped wafer is divided into quarters by use of the cutting apparatus 2, as depicted in FIG. 1. As is well known, a device is formed in each of regions on the front surface of the wafer partitioned by a plurality of crossing division lines (streets), and an outer periphery of the wafer is formed with a notch indicative of the crystal orientation of the wafer.

When the wafer is divided into quarters, the wafer is divided into a wafer piece 11A in the first quadrant, a wafer piece 11B in the second quadrant, a wafer piece 11C in the third quadrant, and a wafer piece 11D in the fourth quadrant in an XY rectangular coordinate system. Referring to FIGS. 2A to 2D, there are depicted plan views of wafer units 21A, 21B, 21C, and 21D in each of which the back surface of the sector-shaped wafer piece obtained by quadrisecting the wafer is adhered to a dicing tape T having an outer peripheral portion attached to an annular frame F.

Figure 2B:
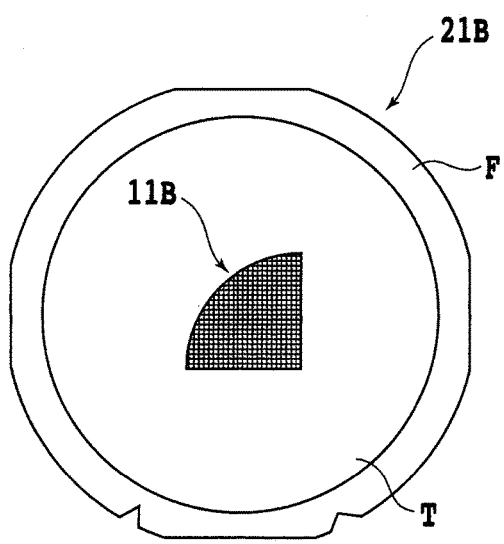
FIGS. 2A to 2D are plan views of wafer units, depicting four patterns of quarter wafer pieces.
Figure 2A:
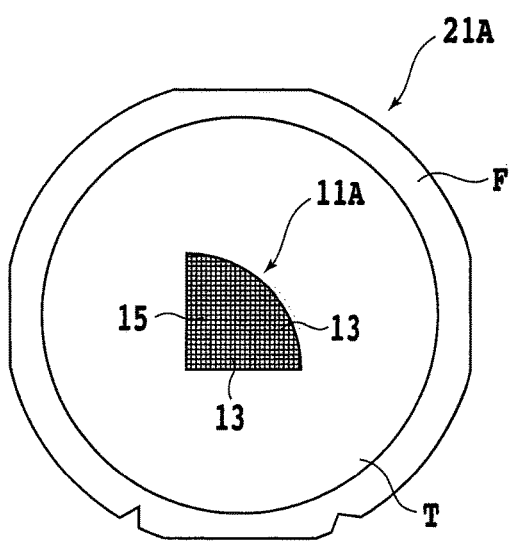
Figure 2C:
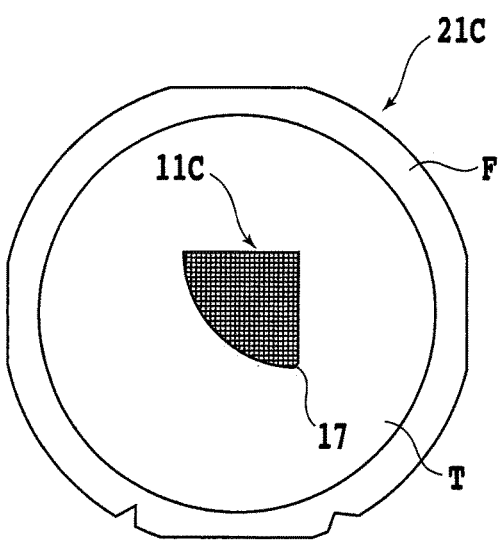
Figure 2D:
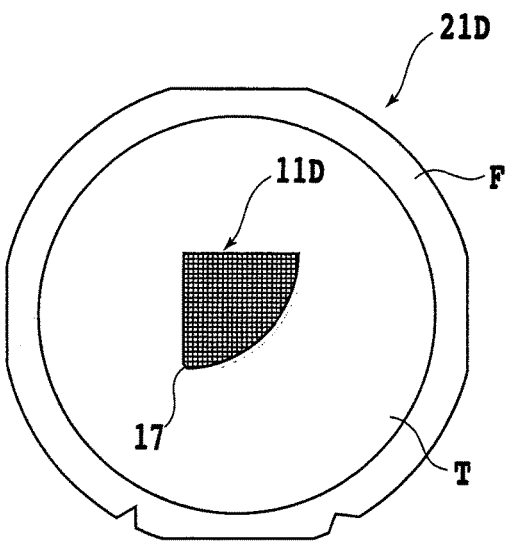

FIG. 2A is a plan view of the wafer unit 21A in which the quarter wafer piece 11A in the first quadrant is supported by the annular frame F through the dicing tape T, and FIG. 2B is a plan view of the wafer unit 21B in which the quarter wafer piece 11B in the second quadrant is supported by the annular frame F. FIG. 2C is a plan view of the wafer unit 21C in which the quarter wafer piece 11C in the third quadrant is supported by the annular frame F, and FIG. 2D is a plan view of the wafer unit 21D in which the quarter wafer piece 11D in the fourth quadrant is supported by the annular frame F.

As depicted in FIGS. 2A to 2D, the quarter wafer pieces 11A to 11D are individually in four patterns; in the embodiment illustrated, the quarter wafer piece 11C in the third quadrant and the quarter wafer piece 11D in the fourth quadrant each have a half of a notch 17 divided at the notch 17 portion.

In the processing method for a sector-shaped wafer piece in the embodiment of the present invention, an information collecting step of collecting information on the shapes of the four patterns of the quarter wafer pieces (sector-shaped wafer pieces) different in the position of a circular arc of an outer periphery, in the case where the quarter wafer pieces 11A to 11D with the crystal orientation positioned in a predetermined direction are each held by the holding surface 10a of the chuck table 10, and information on processing feed quantities corresponding to the shapes of the four patterns.

The information collecting step is carried out with the wafer's crystal orientation positioned in a predetermined direction, for the reason that the accuracy of detection of a target pattern formed in a device 15 by the imaging unit 38 is limited to approximately 10 degrees from the crystal orientation. For this reason, it is necessary to form in four kinds the wafer units 21A to 21D in which the shapes 11A to 11D of the four patterns of the quarter wafer pieces are each supported, in the quadrisected state, by the annular frame F through the dicing tape T, as depicted in FIGS. 2A to 2D.

Figure 3:
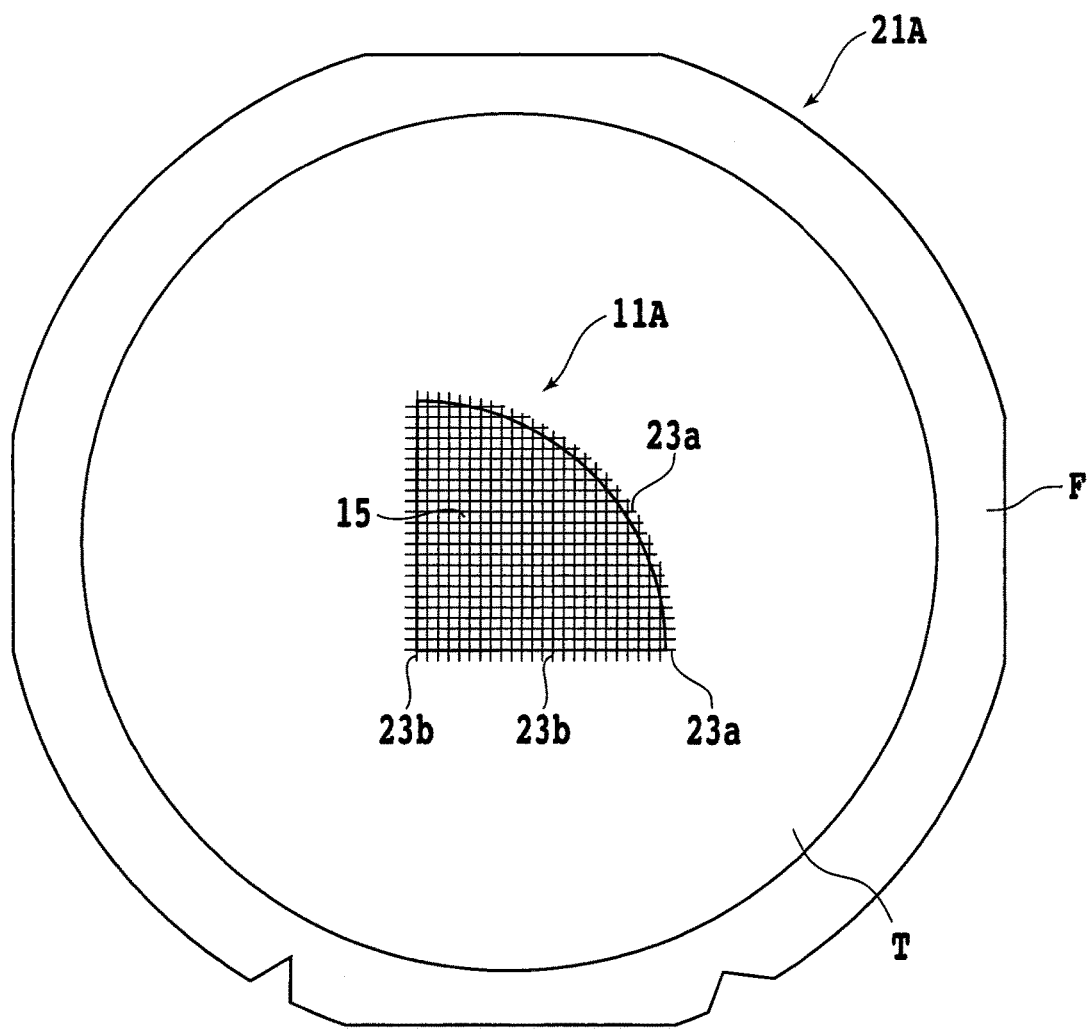
FIG. 3 is a plan view of a wafer unit depicting schematically a processing feed quantity.

In performing the information collecting step, the information is preliminarily collected and stored in a memory of a controller of the processing apparatus, prior to starting the processing of the quarter wafer pieces 11A to 11D. The processing feed quantities to be preliminarily collected will be described referring to FIG. 3.

The wafer unit 21A is a wafer unit in which the quarter wafer piece 11A in the first quadrant is supported by the annular frame F through the dicing tape F. A processing quantity 23a at the time of processing a division line 13 extending in a first direction of the quarter wafer piece 11A is set in such a manner as to gradually decrease along a circular arc in going in the Y-axis direction, and values of the thus set processing quantity 23a are stored in the memory of the controller.

A processing quantity 23b at the time of processing a division line 13 extending in a second direction is also set in such a manner as to gradually decrease along a circular arc in going in the indexing feed direction, based on the assumption that the chuck table 10 is rotated counterclockwise by 90 degrees and the processing is conducted, and information on the thus set processing quantity 23b is stored in the memory of the controller.

In regard of the quarter wafer piece 11B in the second quadrant, the quarter wafer piece 11C in the third quadrant, and the quarter wafer piece 11D in the fourth quadrant, also, information on the processing feed quantity corresponding to the shape of the quarter wafer piece is stored in the memory of the controller.

In the following description, the wafer unit 21A in which the quarter wafer piece 11A in the first quadrant is supported by the annular frame F through the dicing tape T will be mainly described. In the processing method for a sector-shaped wafer piece in the present embodiment, after the wafer unit forming step and the information collecting step are conducted, a holding step of suction holding the quarter wafer piece 11A of the wafer unit 21A by the chuck table 10 of the cutting apparatus 2 through the dicing tape T is carried out.

In a state in which the quarter wafer piece 11A is thus suction held by the chuck table 10 through the dicing tape T, an alignment step of imaging the quarter wafer piece 11A by the imaging unit 38 of the cutting apparatus 2 and aligning the division line 13 extending in the first direction to a processing feed direction (X-axis direction), based on the target patterns formed in the devices 15, is performed.

In this alignment step, the chuck table 10 is put to θ rotation such that a straight line connecting the targets in the devices 15 spaced apart in the X-axis direction is set parallel to the X-axis direction, and the cutting unit 14 is moved in the Y-axis direction by the distance between the center of an adjacent division line and the target pattern, whereby the division line 13 to be cut and the cutting blade of the cutting unit 14 are aligned in the X-axis direction.

Figure 4:
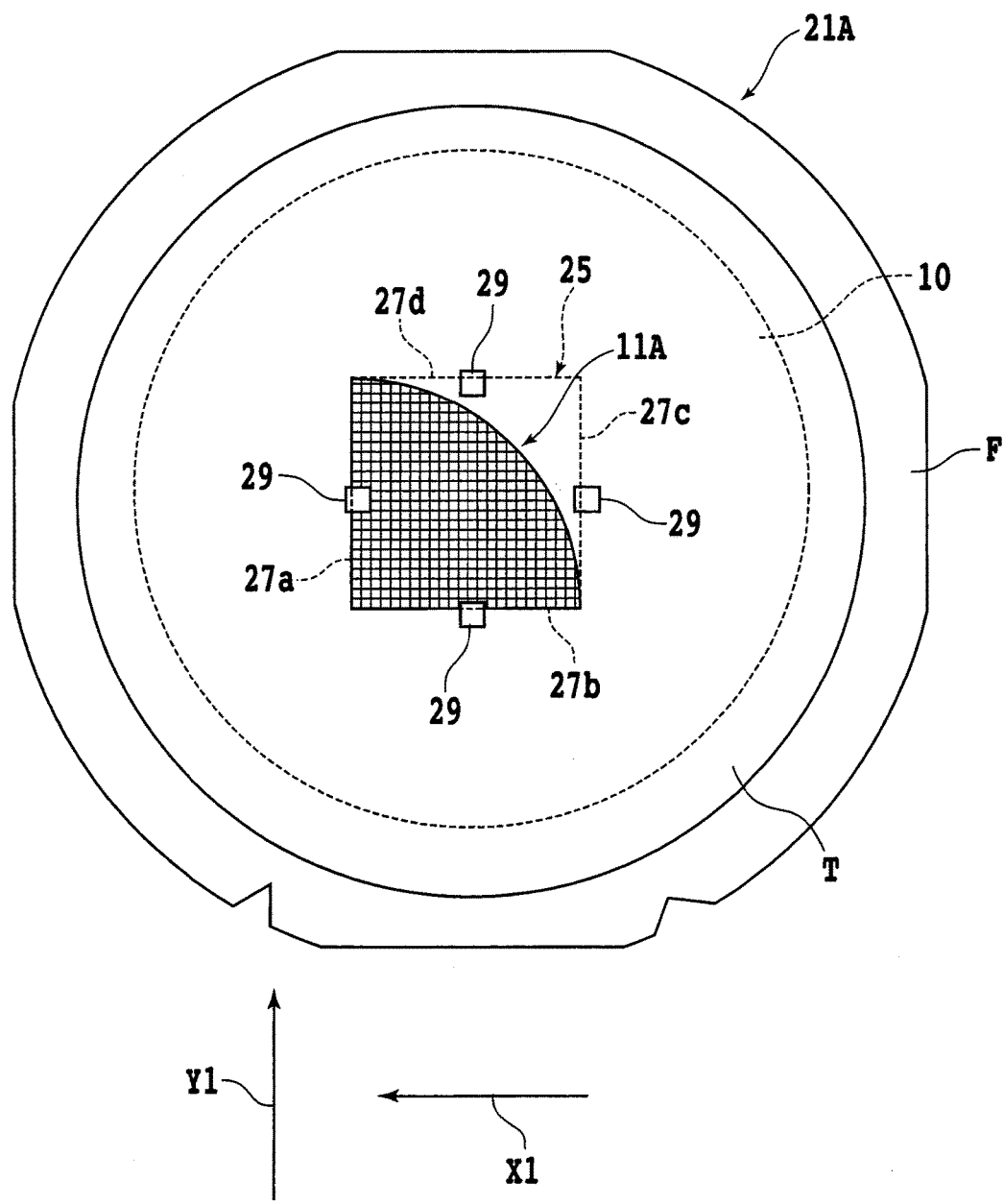
FIG. 4 is a plan view of a wafer unit for explaining a pattern selection step.

After the alignment step is conducted, a pattern selection step of selecting that one of the four patterns to which the held quarter wafer piece corresponds is performed. In this pattern selection step, as depicted in FIG. 4, a square 25 including the orthogonal two sides 27a and 27b of the quarter wafer piece 11A is calculated. Sides 27c and 27d are other two sides of the square 25 drawn imaginarily. After the square 25 is thus calculated imaginarily, a target pattern search zone 29 is set at a substantially central portion of each of the sides 27a to 27d.

The target pattern search zones 29 set on the sides 27a to 27d are imaged by the imaging unit 38, and the presence/absence of the target pattern in each of target pattern search zones 29 is checked. In the target pattern search zones 29 on the sides 27a and 27b, the target pattern set in the device 15 is determined to be present. On the other hand, in the target pattern search zones 29 set on the imaginary sides 27c and 27d, the device is absent in the target pattern search zone 29, and, therefore, the target pattern is determined to be absent. From the detection results, a selection indicating that the quarter wafer piece 11A depicted in FIG. 4 is the wafer piece 11A in the first quadrant is made (pattern selection step).

In regard of the quarter wafer piece 11B in the second quadrant, the quarter wafer piece 11C in the third quadrant, and the quarter wafer piece 11D in the fourth quadrant, also, pattern selection is performed by the same method as above. In FIG. 4, arrow X1 indicates the processing feed direction, and arrow Y1 indicates the indexing feed direction.

Specifically, the pattern selection step includes a target pattern detection step of calculating the region of the square 25 having vertical and horizontal sides equal to the two sides of the quarter wafer piece, searching for the target pattern in the device at a substantially central portion of each of the four sides 27a to 27d of the square 25 by the imaging unit 38, and detecting the target patterns from the two sides of the quarter wafer piece, and a selection step of selecting, based on the positions of the sides where the target pattern has been detected, that one of the first quadrant, the second quadrant, the third quadrant, and the fourth quadrant of the wafer in the XY rectangular coordinate system before quadrisection to which the quarter wafer piece corresponds.

After the pattern selection step is conducted, a processing step of cutting the quarter wafer piece held by the chuck table 10 by the cutting blade of the cutting unit 14 along the division line 13 with a processing feed quantity corresponding to the selected pattern is performed.

In the processing step, the processing feed quantity can be automatically optimized and efficient processing can be carried out, since the information on the processing feed quantities corresponding to the shapes of the four patterns have preliminarily been stored in the memory of the controller in the information collecting step.

While cutting of the quarter wafer pieces (sector-shaped wafer pieces) 11A to 11D by the cutting blade of the cutting apparatus 2 is conducted in the aforementioned embodiment, a laser processing apparatus may be used in place of the cutting apparatus 2, and ablation processing or inside processing of forming modified layers in the inside of the wafer may be performed by applying a laser beam along the division lines 13.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing method for a sector-shaped wafer piece, for processing a sector-shaped quarter wafer piece obtained by dividing into quarters a disk-shaped wafer which has a device formed in each of regions on its front surface partitioned by a plurality of crossing division lines and which has at its outer periphery a notch indicative of its crystal orientation, the processing being performed along the division lines, and the processing being performed with a processing feed quantity according to a shape of the quarter wafer piece, the processing method comprising:
    an information collecting step of collecting information on shapes of four patterns of the quarter wafer pieces which are different in position of a circular arch of an outer periphery in the case where the quarter wafer pieces with the crystal orientation positioned in a predetermined direction are each held by a holding surface of a chuck table, and on processing feed quantities corresponding to the shapes of the four patterns;
    a wafer unit forming step of adhering a back surface of the quarter wafer piece to a dicing tape having an outer peripheral portion attached to an annular frame, to form a wafer unit;
    a holding step of suction holding the quarter wafer piece of the wafer unit by a chuck table of a processing apparatus through the dicing tape after the wafer unit forming step is conducted;
    an alignment step of imaging the quarter wafer piece by an imaging unit of the processing apparatus, and aligning the division line extending in a first direction to a processing feed direction, based on target patterns formed in the devices after the holding step is conducted;
    a pattern selection step of selecting that one of the four patterns to which the quarter wafer piece held by the chuck table corresponds after the alignment step is conducted; and
    a processing step of processing the quarter wafer piece held by the chuck table along the division line with the processing feed quantity corresponding to the selected pattern after the pattern selection step is conducted.

2. The processing method for a sector-shaped wafer piece according to claim 1,
    wherein the pattern selection step includes:
    a target pattern detection step of calculating a region of a square having vertical and horizontal sides equal to two sides of the quarter wafer piece, searching for the target pattern in the device at a center of each of the four sides of the square by the imaging unit, and detecting the target patterns from the two sides of the quarter wafer piece; and
    a selection step of selecting, based on the positions of the sides where the target pattern has been detected, that one of a first quadrant, a second quadrant, a third quadrant, and a fourth quadrant of the wafer in an XY rectangular coordinate system before quadrisection to which the quarter wafer piece corresponds.

3. The processing method for a sector-shaped wafer piece according to claim 1, wherein in the processing step, the division lines are cut by a cutting blade of a cutting apparatus.

4. The processing method for a sector-shaped wafer piece according to claim 1, wherein in the processing step, processing is conducted by applying a laser beam along the division lines.

5. The processing method for a sector-shaped wafer piece according to claim 1, wherein in the pattern selection step, a square is calculated, where the square includes two orthogonal sides of the quarter wafer piece and two imaginary sides, and a target pattern search zone is set at a central portion of each of the orthogonal sides and the imaginary sides.

6. The processing method for a sector-shaped wafer piece according to claim 5, further comprising a target pattern searching step that includes searching for the target pattern in the device at a center of each of the orthogonal sides and imaginary sides of the square by the imaging unit, and detecting the target patterns based on the orthogonal sides and the imaginary sides of the square.

* * * * *